United States Patent
Murakami

(10) Patent No.: US 11,380,538 B2
(45) Date of Patent: Jul. 5, 2022

(54) METHOD OF FORMING NITRIDE FILM AND APPARATUS FOR FORMING NITRIDE FILM

(71) Applicant: TOKYO ELECTRON LIMITED, Tokyo (JP)

(72) Inventor: Hiroki Murakami, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/738,257

(22) Filed: Jan. 9, 2020

(65) Prior Publication Data

US 2020/0219716 A1 Jul. 9, 2020

(30) Foreign Application Priority Data

Jan. 9, 2019 (JP) .............................. JP2019-002170
Sep. 30, 2019 (JP) .............................. JP2019-180849

(51) Int. Cl.
*H01L 21/02* (2006.01)

(52) U.S. Cl.
CPC .... *H01L 21/0217* (2013.01); *H01L 21/02274* (2013.01)

(58) Field of Classification Search
CPC ........... H01L 221/0337; H01L 21/0276; H01L 21/0332; H01L 21/32139; H01L 21/31116
See application file for complete search history.

(56) References Cited

U.S. PATENT DOCUMENTS

| | | | | |
|---|---|---|---|---|
| 2009/0170345 | A1* | 7/2009 | Akae | H01L 21/02211 438/786 |
| 2014/0065840 | A1* | 3/2014 | Akae | H01L 21/3185 118/704 |
| 2015/0031216 | A1* | 1/2015 | Akae | C23C 16/45529 118/704 |
| 2015/0115312 | A1* | 4/2015 | Saga | H01L 33/0075 257/101 |
| 2018/0233351 | A1* | 8/2018 | Nakamura | H01L 21/0217 |
| 2018/0301716 | A1* | 10/2018 | Choi | C23C 16/26 |

FOREIGN PATENT DOCUMENTS

JP 2010-283385 A 12/2010

* cited by examiner

*Primary Examiner* — Telly D Green
*Assistant Examiner* — Andre C Stevenson
(74) *Attorney, Agent, or Firm* — Nath, Goldberg & Meyer; Jerald L. Meyer; Tanya E. Harkins

(57) ABSTRACT

A nitride film forming method includes repeating a cycle a plurality of times, wherein the cycle includes: forming a layer containing an element to be nitrided on a substrate by supplying a source gas including the element to the substrate; plasmarizing a modifying gas including a hydrogen gas, and modifying the layer containing the element with the plasmarized modifying gas; and activating a nitriding gas including nitrogen by heat, and thermally nitriding the layer containing the element with the nitriding gas activated by heat.

14 Claims, 11 Drawing Sheets

METHOD OF FORMING NITRIDE FILM AND APPARATUS FOR FORMING NITRIDE FILM

CROSS-REFERENCE TO RELATED APPLICATIONS

This application is based upon and claims the benefit of priority from Japanese Patent Application No. 2019-002170, filed on Jan. 9, 2019, and Japanese Patent Application No. 2019-180849, filed on Sep. 30, 2019, the entire contents of which are incorporated herein by reference.

TECHNICAL FIELD

The present disclosure relates to a method of forming a nitride film and an apparatus for forming a nitride film.

BACKGROUND

Patent document 1 discloses a method of forming a silicon nitride film. In this film forming method, a cycle including a reactant forming process, a chlorine removing process, and a silicon nitride film forming process is repeated a plurality of times. In the reactant forming process, dichlorosilane is supplied into a reaction chamber accommodating a substrate to form a reactant of the substrate and the dichlorosilane on the substrate. In the chlorine removing process, hydrogen is supplied into to a plasma forming chamber to form hydrogen radicals, and the formed hydrogen radicals are supplied from the plasma forming chamber into the reaction chamber. In the silicon nitride film forming process, ammonia is supplied to the plasma forming chamber to form ammonia radicals, and the formed ammonia radicals are supplied from the plasma forming chamber into the reaction chamber.

PRIOR TECHNICAL DOCUMENTS

Patent Documents

Patent document 1: Japanese laid-open publication No. 2010-283385

SUMMARY

A nitride film forming method includes repeating a cycle a plurality of times, wherein the cycle includes: forming a layer containing an element to be nitrided on a substrate by supplying a source gas including the element to the substrate; plasmarizing a modifying gas including a hydrogen gas, and modifying the layer containing the element with the plasmarized modifying gas; and activating a nitriding gas including nitrogen by heat, and thermally nitriding the layer containing the element with the nitriding gas activated by heat.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
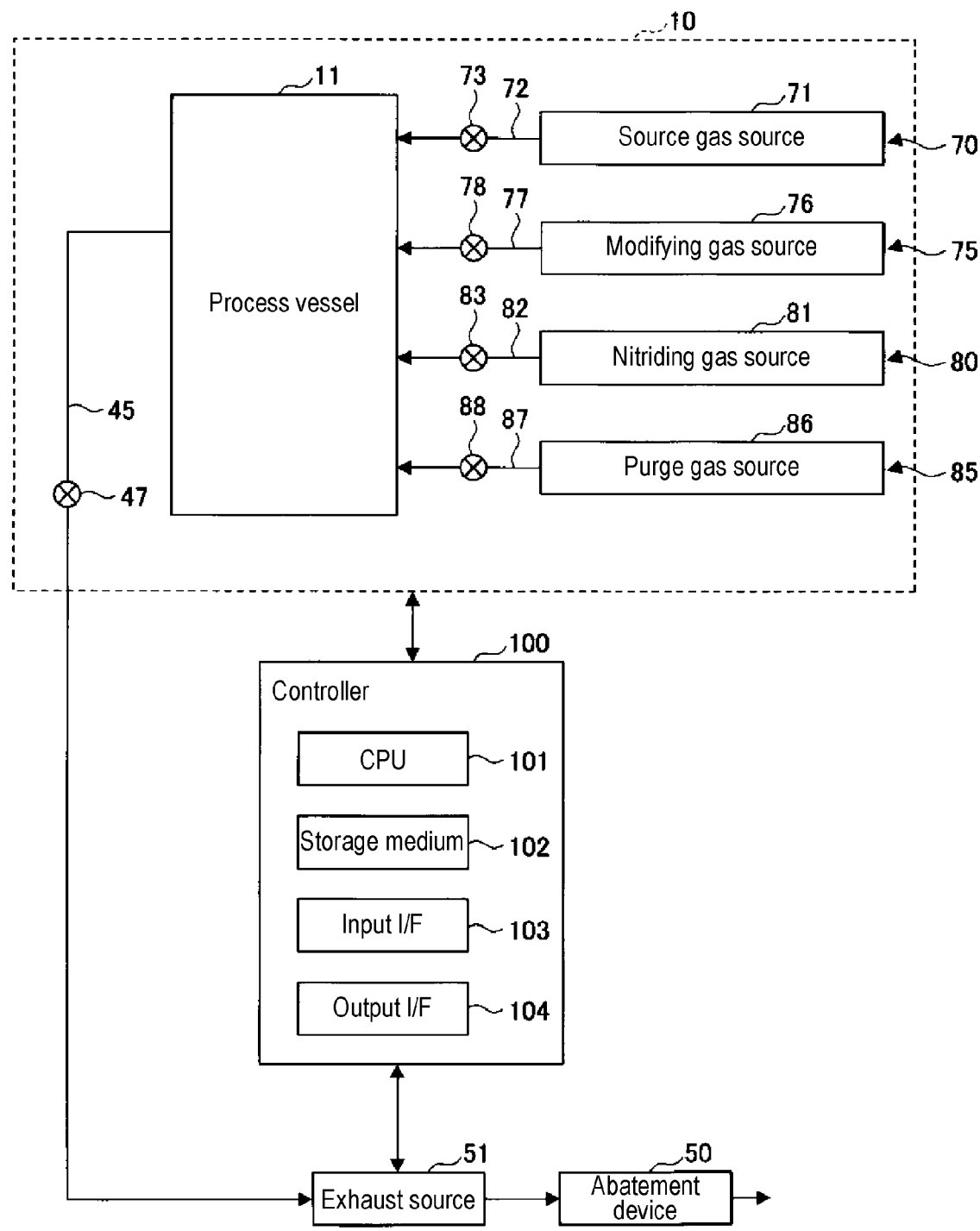
FIG. 1 is a view illustrating a film forming apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings. Further, the same or corresponding features in the drawings will be denoted by the same or corresponding reference numerals, and a detailed description thereof will be omitted.

(Film Forming Apparatus)

FIG. 1 is a view illustrating a film forming apparatus according to an embodiment. A film forming apparatus 1 forms a nitride film on a substrate through atomic layer deposition (ALD) method. The nitride film is, for example, a silicon nitride film. The silicon nitride film is formed on the substrate by alternately supplying a source gas (for example, a dichlorosilane gas) and a nitriding gas (for example, an ammonia gas) to the substrate. The film forming apparatus 1 includes, for example, a process unit 10, an abatement device 50, an exhaust source 51, and a controller 100.

Figure 2:
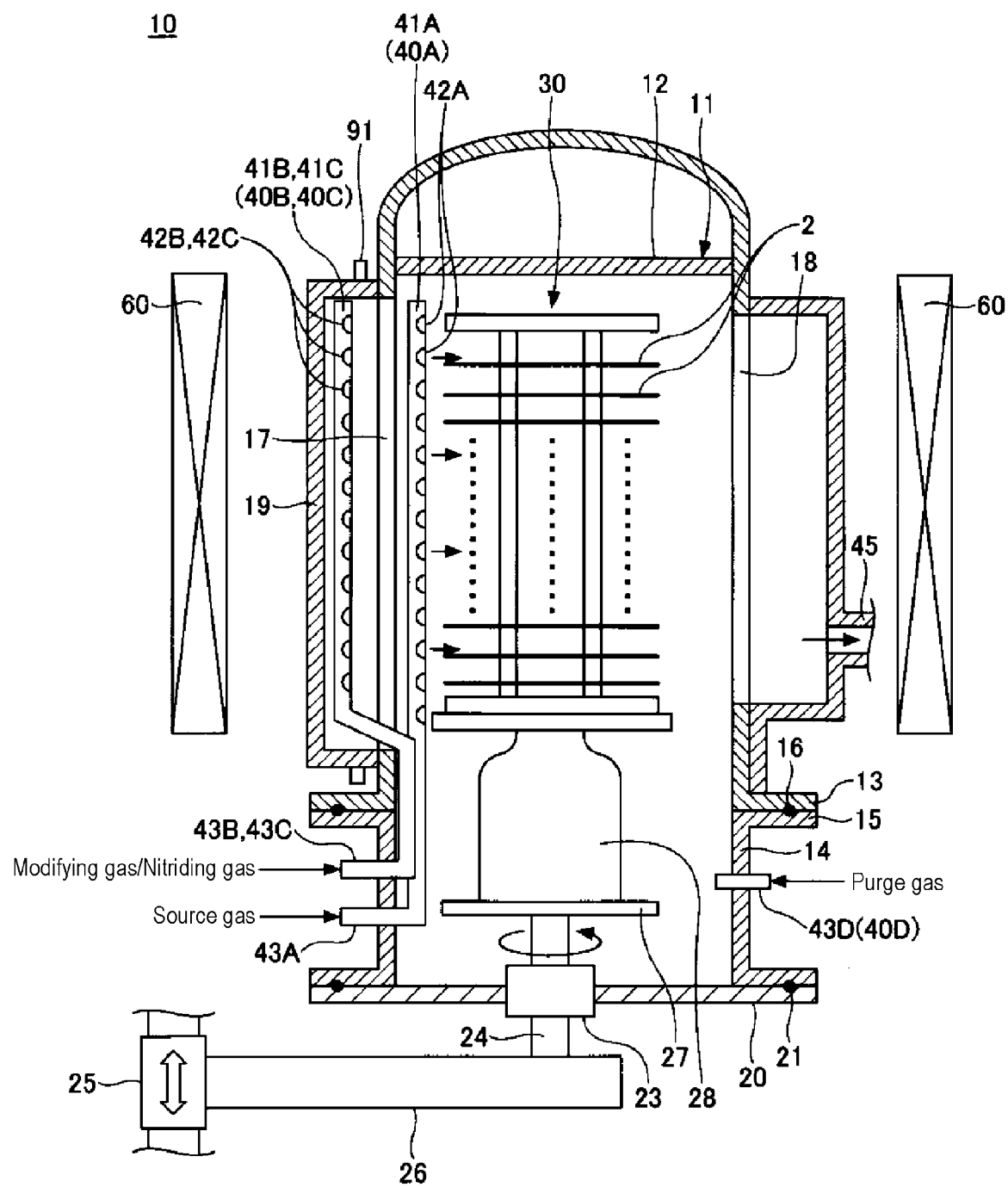
FIG. 2 is a view illustrating a process unit according to an embodiment.

FIG. 2 is a view illustrating a process unit according to an embodiment. The process unit 10 illustrated in FIG. 2 is a batch type vertical heat treatment device that simultaneously performs heat treatment on a plurality of substrates. However, the process unit 10 is not limited to the vertical heat treatment device. For example, the process unit 10 may be a sheet-by-sheet processing device that processes a substrate 2 at a time. Further, the process unit 10 may be a semi-batch type device. In the semi-batch type device, a plurality of substrates disposed circumferentially about a rotational center axis of a rotary table is rotated with a rotation of the rotary table, and passes through a plurality of regions to which different types of gases are supplied.

As illustrated in FIG. 2, the process unit 10 includes a process vessel 11 in which a space for processing a substrate 2 therein is defined, a lid 20 that airtightly closes an opening formed at a lower end of the process vessel 11, and a substrate holder 30 that holds the substrate 2. The substrate 2 is, for example, a semiconductor substrate, and more specifically, for example, a silicon wafer. The substrate holder 30 is also referred to as a wafer boat.

The process vessel 11 has a cylindrical process vessel body 12 having a ceiling and an open lower end. The process vessel body 12 is formed of, for example, quartz. A flange 13 is formed at the lower end of the process vessel body 12. Further, the process vessel 11 has, for example, a cylindrical manifold 14. The manifold 14 is formed of, for example, stainless steel. A flange 15 is formed at an upper end of the manifold 14, and the flange 13 of the process vessel body 12 is provided on the flange 15. A seal member 16 such as an O-ring is interposed between the flange 15 and the flange 13.

The lid 20 is airtightly installed at a lower end opening of the manifold 14 through a sealing member 21 such as an O-ring. The lid 20 is formed of, for example, stainless steel. A through-hole that vertically passes through the lid 20 is formed at a central portion of the lid 20. A rotary shaft 24 is disposed in the through-hole. A gap between the lid 20 and the rotary shaft 24 is sealed by a magnetic fluid sealing 23. A lower end of the rotary shaft 24 is rotatably supported by an arm 26 of an elevation part 25. A rotary plate 27 is provided at an upper end of the rotary shaft 24. A substrate holder 30 is installed on the rotary plate 27 through a thermal insulator 28.

The substrate holder 30 holds a plurality of substrates 2 with vertical intervals. Each of the plurality of substrates 2 is held horizontally. The substrate holder 30 is formed of, for example, quartz ($SiO_2$) or silicon carbide (SiC). When the elevation part 25 moves upward, the lid 20 and the substrate holder 30 are moved upward, and the substrate holder 30 is loaded into the interior of the process vessel 11 and the opening at the lower end of the process vessel 11 is closed by the lid 20. Further, when the elevation part 25 moves downward, the lid 20 and the substrate holder 30 are moved downward, and the substrate holder 30 is unloaded from the process vessel 11. Further, when the rotary shaft 24 rotates, the substrate holder 30 is rotated together with the rotary plate 27.

The process unit 10 has four gas supply pipes 40A, 40B, 40C, and 40D. The gas supply pipes 40A, 40B, 40C, and 40D are formed of, for example, quartz ($SiO_2$). The gas supply pipes 40A, 40B, 40C, and 40D supply gases to the interior of the process vessel 11. Since four types of gases are used in the present embodiment, the four gas supply pipes 40A, 40B, 40C, and 40D are provided. The types of the gases will be described later. Alternatively, a plurality of gases may be sequentially discharged from one gas supply pipe. Further, the same type of gas may be discharged simultaneously from a plurality of gas supply pipes.

The gas supply pipes 40A, 40B, and 40C have vertical pipes 41A, 41B, and 41C that are, for example, vertically disposed in the interior of the process vessel 11, respectively. A plurality of gas supply holes 42A, 42B, and 42C is formed in the vertical pipes 41A, 41B, and 41C at vertical intervals, respectively. Gases are horizontally discharged from the plurality of gas supply holes 42A, 42B, and 42C. The gas supply pipes 40A, 40B, and 40C have horizontal pipes 43A, 43B, and 43C that horizontally pass through the manifold 14, respectively. Gases supplied to the horizontal pipes 43A, 43B, and 43C reach the vertical pipes 41A, 41B, and 41C, and are horizontally discharged from the gas supply holes 42A, 42B, and 42C, respectively. The gas supply pipe 40D has a horizontal pipe 43D that horizontally passes through the manifold 14. Gas supplied to the horizontal pipe 43D is horizontally discharged to the interior of the manifold 14.

The process unit 10 has an exhaust pipe 45. The exhaust pipe 45 exhausts the interior of the process vessel 11. An exhaust port 18 to exhaust the interior of the process vessel 11 is formed in the process vessel body 12. The exhaust port 18 faces the gas supply holes 42A, 42B, and 42C. The gases horizontally discharged from the gas supply holes 42A, 42B, and 42C, respectively, pass through the exhaust port 18 and are exhausted from the exhaust pipe 45.

As illustrated in FIG. 1, the exhaust pipe 45 connects the process vessel 11 and the abatement device 50, and delivers the gases exhausted from the process vessel 11 to the abatement device 50. The abatement device 50 removes harmful substances from the exhausted gases and discharges the exhausted gases to the atmosphere. An opening/closing valve 47 and an exhaust source 51 are provided in the exhaust pipe 45 in the order from the upstream side to the downstream side. The opening/closing valve 47 opens and closes the interior of the exhaust pipe 45. The opening/closing valve 47 also functions as a pressure control valve that controls a pressure in the interior of the process vessel 11. The exhaust source 51 includes a vacuum pump, and suctions the gases in the interior of the process vessel 11 and outputs the suctioned gases to the abatement device 50.

As illustrated in FIG. 2, the process unit 10 has a process vessel heater 60. The process vessel heater 60 heats the interior of the process vessel 11 to enhance processing capacity of the gases supplied to the process vessel 11. The process vessel heater 60 is disposed outside the process vessel 11, and heats the interior of the process vessel 11 from the outside of the process vessel 11. For example, the process vessel heater 60 has a cylindrical shape surrounding the process vessel body 12. The process vessel heater 60 is formed of, for example, an electric heater.

As illustrated in FIG. 1, the process unit 10 has a source gas supply mechanism 70, a modifying gas supply mechanism 75, a nitriding gas supply mechanism 80, and a purge gas supply mechanism 85. The source gas supply mechanism 70 supplies a source gas to the interior of the process vessel 11. The source gas includes an element (for example, silicon) to be nitrided.

A dichlorosilane (DCS: $SiH_2Cl_2$) gas, for example, is used as the source gas. Further, although the source gas of the present embodiment is a DCS gas, the technology of the present disclosure is not limited thereto. In addition to the DCS gas, for example, a monochlorosilane (MCS: $SiH_3Cl$) gas, a trichlorosilane (TCS: $SiHCl_3$) gas, a silicon tetrachloride (STC: $SiCl_4$) gas, and a hexachlorodisilane (HCDS: $Si2Cl_6$) gas may be used as the source gas. By supplying the above-mentioned gases to the substrate 2, a Si-containing layer including silicon (Si) may be formed on the substrate 2. The Si-containing layer includes a halogen element, in addition to Si. This is because the source gas includes a halogen element.

The source gas supply mechanism 70 has a source gas source 71, a source gas pipe 72, and a source gas flow rate control valve 73. The source gas pipe 72 connects the source gas source 71 and the gas supply pipe 40A, and delivers the source gas from the source gas source 71 to the gas supply pipe 40A. The source gas is horizontally discharged from the gas supply holes 42A of the vertical pipe 41A toward the substrate 2. The source gas flow rate control valve 73 is provided in the source gas pipe 72, and controls a flow rate of the source gas.

The modifying gas supply mechanism 75 supplies a modifying gas to the interior of the process vessel 11 to modify the Si-containing layer. Modification of the Si-containing layer includes, for example, removing the halogen element included in the Si-containing layer. By removing the halogen element, dangling bonds of Si may be formed. As a result, the Si-containing layer may be activated, and nitriding the Si-containing layer may be expedited. The modification gas includes a hydrogen ($H_2$) gas and/or an inert gas. The modification gas may be any one of a hydrogen gas only, an inert gas only, and a mixture of a hydrogen gas and an inert gas. A rare gas such as an Ar gas or a $N_2$ gas may be used as the inert gas. Further, when the $N_2$ gas is used as the modifying gas, the Si-containing layer is modified under a condition that suppresses the Si-containing layer from being nitrided.

The modifying gas supply mechanism 75 has a modifying gas source 76, a modifying gas pipe 77, and a modifying gas flow rate control valve 78. The modifying gas pipe 77 connects the modifying gas source 76 and the gas supply pipe 40B, and delivers the modifying gas from the modifying gas source 76 to the gas supply pipe 40B. The modifying gas is horizontally discharged from the gas supply holes 42B of the vertical pipe 41B toward the substrate 2. The modifying gas flow rate control valve 78 is provided in the modifying gas pipe 77, and controls a flow rate of the modifying gas.

The nitriding gas supply mechanism 80 supplies a nitriding gas to the interior of the process vessel 11 to nitride the Si-containing layer. For example, an ammonia gas ($NH_3$) gas, an organic hydrazine compound gas, an amine-based gas, a NO gas, a $N_2O$ gas, or a $NO_2$ gas is used as the nitriding gas. For example, a hydrazine ($N_2H_4$) gas, a diazene ($N_2H_2$) gas, or a monomethylhydrazene (MMH) gas is used as the organic hydrazine compound gas. For example, a monomethylamine gas or the like is used as the amine-based gas.

The nitriding gas supply mechanism 80 has a nitriding gas source 81, a nitriding gas pipe 82, and a nitriding gas flow rate control valve 83. The nitriding gas pipe 82 connects the nitriding gas source 81 and the gas supply pipe 40C, and delivers the nitriding gas from the nitriding gas source 81 to the gas supply pipe 40C. The nitriding gas is horizontally discharged from the gas supply holes 42C of the vertical pipe 41C toward the substrate 2. The nitriding gas flow rate control valve 83 is provided in the nitriding gas pipe 82, and controls a flow rate of the nitriding gas.

The purge gas supply mechanism 85 supplies the purge gas into the process vessel 11 to remove the source gas, the modifying gas, and the nitriding gas remaining in the interior of the process vessel 11. For example, an inert gas is used as the purge gas. A rare gas such as an Ar gas or a $N_2$ gas may be used as the inert gas.

The purge gas supply mechanism 85 has a purge gas source 86, a purge gas pipe 87, and a purge gas flow rate control valve 88. The purge gas pipe 87 connects the purge gas source 86 and the gas supply pipe 40D, and delivers the purge gas from the purge gas source 86 to the gas supply pipe 40D. The purge gas is horizontally discharged from the horizontal pipe 43D into the interior of the manifold 14. The purge gas flow rate control valve 88 is provided in the purge gas pipe 87, and controls a flow rate of the purge gas.

Figure 3:
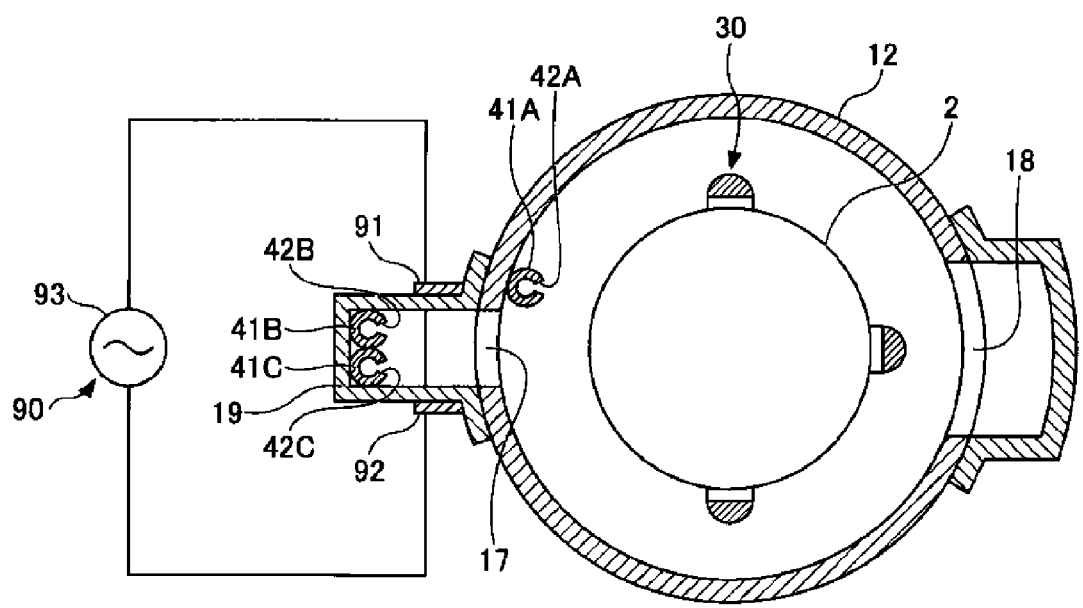
FIG. 3 is a view illustrating a plasma forming mechanism according to an embodiment.

FIG. 3 is a view illustrating a plasma forming mechanism according to an embodiment. As illustrated in FIG. 3, an opening 17 is formed at a circumferential portion of the process vessel body 12. An accommodation part 19 is provided to surround the opening 17. The accommodation part 19 protrudes outward from the process vessel body 12 in a radial direction, and has, for example, a U shape when viewed from a vertical direction.

The accommodation part 19 accommodates the vertical pipe 41B for the modifying gas and the vertical pipe 41C for the nitriding gas. The modifying gas is horizontally discharged from the gas supply holes 42B of the vertical pipe 41B toward the opening 17, and is supplied to the interior of the process vessel body 12 through the opening 17. The nitriding gas is horizontally discharged from the gas supply holes 42C of the vertical pipe 41C toward the opening 17, and is supplied to the interior of the process vessel body 12 through the opening 17.

The vertical pipe 41A for the source gas is disposed outside the accommodation part 19 and inside the process vessel body 12.

The vertical pipe 41C for the nitriding gas is disposed in the accommodation part 19 in the present embodiment, for the purpose of plasmarizing the nitriding gas in Comparative Example 2, which will be described later. However, the technology of the present disclosure is not limited thereto. Since the nitriding gas is not plasmarized in Examples 1 to 4 to be described later, the vertical pipe 41C for the nitriding gas may be disposed outside the accommodation part 19 and inside the process vessel body 12, like the vertical pipe 41A for a material gas.

A plasma forming mechanism 90 has, for example, a pair of electrodes 91 and 92 with the accommodation part 19 interposed therebetween, and a high-frequency source 93 that applies a high-frequency voltage between the pair of electrodes 91 and 92. The pair of electrodes 91 and 92 is elongated in the vertical direction, like the vertical pipe 41B for the modifying gas.

By applying the high-frequency voltage between the pair of electrodes 91 and 92, a high-frequency electric field is applied to the inner space of the accommodation part 19. The modifying gas is plasmarized in the inner space of the accommodation part 19 by the high-frequency electric field. When the modifying gas includes a hydrogen gas, the hydrogen gas is plasmarized to form hydrogen radicals. When the modifying gas includes a nitrogen gas, the nitrogen gas is plasmarized to form nitrogen radicals. When the modifying gas includes an argon gas, the argon gas is plasmarized to form argon radicals. These active species are supplied to the interior of the process vessel body 12 through the opening 17, and modifies the Si-containing layer.

The modification of the Si-containing layer includes, for example, removing the halogen element included in the Si-containing layer. By removing the halogen element, the dangling bonds of Si may be formed. As a result, the Si-containing layer may be activated, and nitriding the Si-containing layer may be expedited. In the present embodiment, the Si-containing layer is nitrided after the modification of the Si-containing layer.

Since the Si-containing layer is modified, the Si-containing layer may be nitrided at a low temperature (for example, equal to or less than 600 degrees C.) without plasmarizing the nitriding gas. Since it is not necessary to plasmarize the nitriding gas, damage to a base can be reduced. In a case where the nitriding gas is plasmarized, the Si-containing layer can be nitrided at a low temperature without modifying the Si-containing layer, but the damage to the base increases. This is because a plasmarized nitriding gas easily reacts with the Si-containing layer and also easily reacts with the base beyond the Si-containing layer. Further, since it is not necessary to plasmarize the nitriding gas, it is possible to suppress deposits from being detached from the process vessel 11, and to reduce a frequency of cleaning the process vessel 11. This is because the plasmarized nitriding gas easily reacts with the deposits deposited on the process vessel 11 to detach the deposits. When the deposits are detached from the process vessel 11, the detached deposits are attached to the substrate 2 as particles.

As illustrated in FIG. 1, the film forming apparatus 1 includes the controller 100. The controller 100 is constituted by, for example, a computer, and includes a central processing unit (CPU) 101 and a storage medium 102 such as a memory. A program that controls various processes executed by the film forming apparatus 1 is stored in the storage medium 102. The controller 100 controls an operation of the film forming apparatus 1 by executing the program stored in the storage medium 102 in the CPU 101. Further, the controller 100 includes an input interface 103 and an output interface 104. The controller 100 receives a signal from the outside through the input interface 103, and transmits a signal to the outside through the output interface 104.

The program may be recorded in a computer readable storage medium, and may be installed in the storage medium 102 of the controller 100 from the computer readable storage medium. The computer readable storage medium includes, for example, a hard disk (HD), a flexible disk (FD), a compact disk (CD), a magnet optical (MO) disk, and a memory card. Further, the program may be downloaded from a server through the Internet, and may be installed in the storage medium 102 of the controller 100.

(Film Forming Method)

Figure 4:
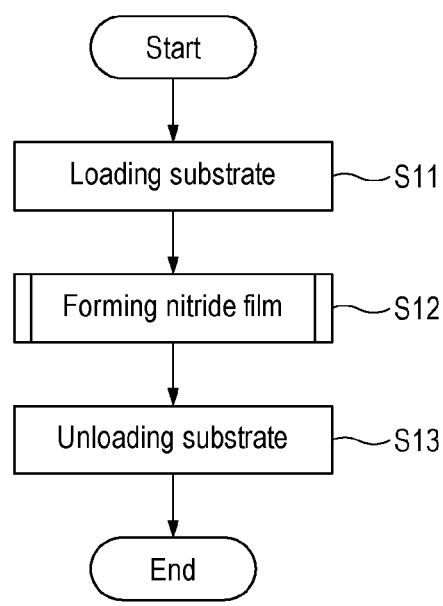
FIG. 4 is a flowchart illustrating a film forming method according to an embodiment.

FIG. 4 is a flowchart illustrating a film forming method according to an embodiment. The steps illustrated in FIG. 4 are repeated while changing the substrates 2 under a control of the controller 100.

The film forming method includes a loading step S11 of loading the substrates 2 into the interior of the process vessel 11. In the loading step S11, first, outside the process vessel 11, a transfer device loads a plurality of substrates 2 on the substrate holder 30. The substrate holder 30 horizontally holds the substrates 2 with vertical intervals. Subsequently, by moving the elevation part 25 upward, the lid 20 and the substrate holder 30 are moved upward. The substrates 2 are loaded into the interior of the process vessel 11 together with the substrate holder 30, and the opening at the lower end of the process vessel 11 is closed by the lid 20.

The film forming method includes a film forming step S12 of forming a nitride film on the substrates 2. In the film forming step S12, a nitride film is formed on the substrates 2 rotated together with the substrate holder 30 by sequentially supplying a plurality of gases to the interior of the process vessel 11 while exhausting the interior of the process vessel 11 such that the pressure of the interior of the process vessel 11 is kept to a set value. In the film forming step S12, the film forming rate is enhanced by heating the interior of the process vessel 11 with the heater 60. After the film forming step S12, a purge gas is supplied, and in turn, exhausting the interior of the process vessel 11 is stopped to return the pressure of the interior of the process vessel 11 to a normal pressure.

The film forming method includes an unloading step S13 of unloading the substrates 2 from the process vessel 11. In the unloading step S13, by moving the elevation part 25 downward, the lid 20 and the substrate holder 30 are moved downward. The lid 20 opens the opening at the lower end of the process vessel 11, and the substrates 2 are unloaded from the process vessel 11 together with the substrate holder 30. Thereafter, the transfer device detaches the substrates 2 from the substrate holder 30. Subsequently, by moving the elevation part 25 upward, the lid 20 and the substrate holder 30 are moved upward. The substrate holder 30 is loaded into the interior of the process vessel 11, and the opening at the lower end of the process vessel 11 is closed by the lid 20.

Figure 5:
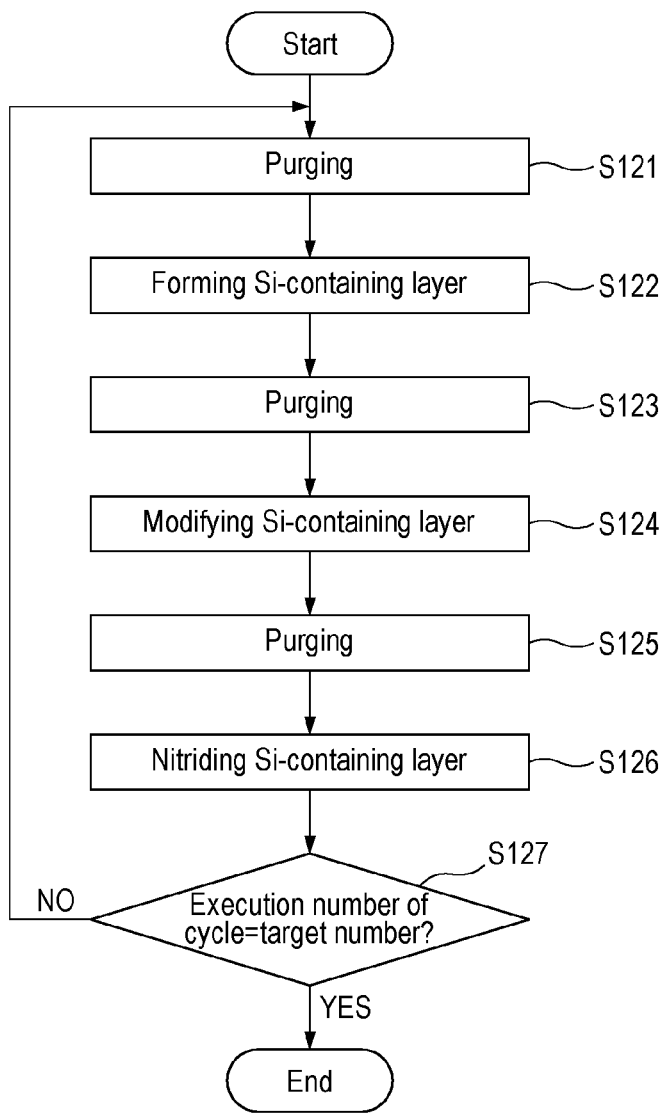
FIG. 5 is a flowchart illustrating an example of a nitride film forming step illustrated in FIG. 4.
Figure 6:
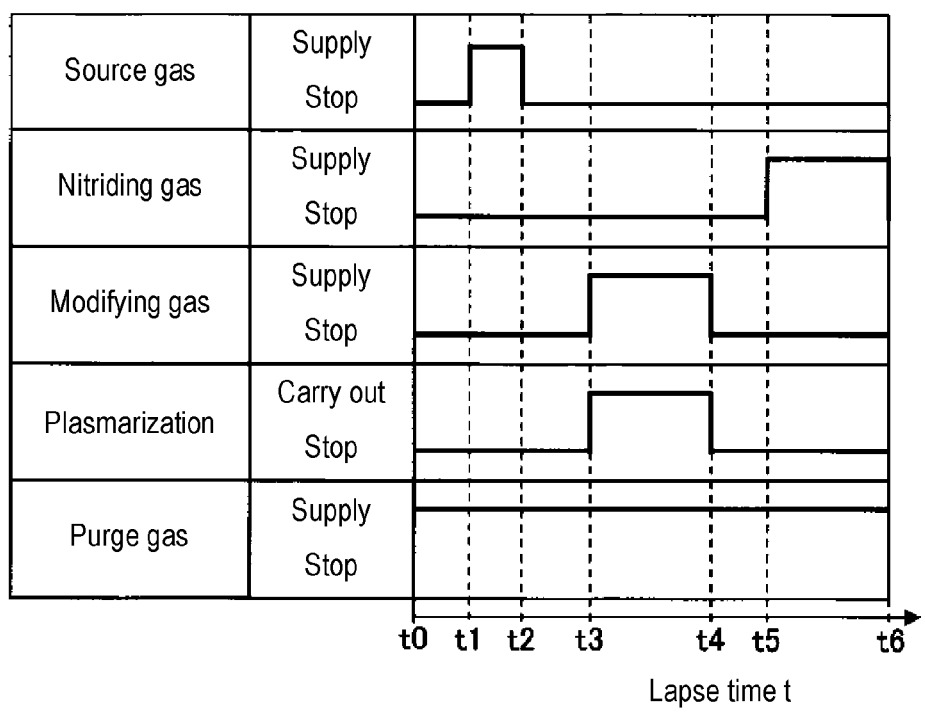
FIG. 6 is a view illustrating an example of operation timings of one cycle illustrated in FIG. 5.

FIG. 5 is a flowchart illustrating an example of the nitride film forming step illustrated in FIG. 4. Steps S121 to S127 illustrated in FIG. 5 are carried out under the control of the controller 100. FIG. 6 is a view illustrating an example of operation timings of one cycle illustrated in FIG. 5.

In the film forming step S12, a cycle described below is repeated, for example, until an execution number of the cycle reaches a target number. The cycle includes, for example, a purging step (step S121), a Si-containing layer forming step (step S122), a purging step (step S123), a Si-containing layer modifying step (step S124), a purging step (step S125), and a Si-containing layer nitriding step (step S126). While the cycle is repeated, a temperature of the substrates 2 is set to be, for example, 400 degrees C. or more and 600 degrees C. or less, and a pressure of the interior of the process vessel 11 is set to be, for example, 13 Pa or more and 665 Pa or less.

The purging step (step S121) is performed from time t0 to time t1 illustrated in FIG. 6. In step S121, a purge gas is supplied to the interior of the process vessel 11 by the purge gas supply mechanism 85 while the interior of the process vessel 11 is exhausted by the exhaust source 51. Accordingly, gases remaining in the interior of the process vessel 11 are replaced by the purge gas. A flow rate of the purge gas is set to be, for example, 10 sccm or more and 5,000 sccm or less. A time period of step S121 is set to be, for example, three seconds or more and ten seconds or less. The purge gas may be supplied from a gas supply mechanism other than the purge gas supply mechanism 85. Further, as illustrated in FIG. 6, the purge gas is continuously supplied to the interior of the process vessel 11 from time t0 to time t6. The flow rate of the purge gas may be appropriately set for the purging step.

The Si-containing layer forming step (step S122) is performed from time t1 to time t2 illustrated in FIG. 6. In step S122, a source gas is supplied to the interior of the process vessel 11 by the source gas supply mechanism 70 while the interior of the process vessel 11 is exhausted by the exhaust source 51. The source gas is, for example, a DCS gas. Accordingly, the Si-containing layers are formed on the substrates 2. A flow rate of the source gas is set to be, for example, 10 sccm or more and 3,000 sccm or less. A time period of step S122 is set to be, for example, 1 seconds or more and 10 seconds or less.

The purging step (step S123) is performed from time t2 to time t3 illustrated in FIG. 6. In step S123, the purge gas is supplied to the interior of the process vessel 11 by the purge gas supply mechanism 85 while the interior of the process vessel 11 is exhausted by the exhaust source 51. Accordingly, gases remaining in the interior of the process vessel 11 is replaced by the purge gas. A flow rate of the purge gas is set to be, for example, 10 sccm or more and 5,000 sccm or less. A time period of step S123 is set to be, for example, 3 seconds or more and 10 seconds or less. The purge gas may be supplied from a gas supply mechanism other than the purge gas supply mechanism 85.

The Si-containing layer modifying step (step S124) is performed from time t3 to time t4 illustrated in FIG. 6. In step S124, a modifying gas is supplied to the interior of the process vessel 11 by the modifying gas supply mechanism 75 while the interior of the process vessel 11 is exhausted by the exhaust source 51. Further, in step S124, the modifying gas is plasmarized by the plasma forming mechanism 90. The modifying gas is, for example, a mixture of a hydrogen gas and a nitrogen gas. The Si-containing layer is modified with the plasmarized modifying gas. The modification of the Si-containing layer includes, for example, removing the halogen element included in the Si-containing layer. By removing the halogen element, the dangling bonds of Si may be formed. As a result, the Si-containing layer may be activated, and the nitration of the Si-containing layer may be expedited. A flow rate of the modifying gas is set to be, for example, 10 sccm or more and 5,000 sccm or less. An electric power of the high-frequency source 93 is set to be, for example, 50 W or more and 300 W or less. A time period of step S124 is set to be, for example, 3 seconds or more and 60 seconds or less.

The purging step (step S125) is performed from time t4 to time t5 illustrated in FIG. 6. In step S125, the purge gas is supplied to the interior of the process vessel 11 by the purge gas supply mechanism 85 while the interior of the process vessel 11 is exhausted by the exhaust source 51. Accordingly, gases remaining in the interior of the process vessel 11 are replaced by the purge gas. A flow rate of the purge gas is set to be, for example, 500 sccm or more and 5,000 sccm or less. A time period of step S125 is set to be, for example, 3 seconds or more and 10 seconds or less. The purge gas may be supplied from a gas supply mechanism other than the purge gas supply mechanism 85.

The Si-containing layer nitriding step (step S126) is performed from time t5 to t6 illustrated in FIG. 6. In step S126, a nitriding gas is supplied to the interior of the process vessel 11 by the nitriding gas supply mechanism 80 while the interior of the process vessel 11 is exhausted by the exhaust source 51. In step S126, the nitriding gas is not plasmarized by the plasma forming mechanism 90. The nitriding gas is, for example, an ammonia gas. The Si-containing layer is thermally nitrided by the ammonia gas activated by heat. A flow rate of the nitriding gas is set to be, for example, 10 sccm or more and 10,000 sccm or less. A time period of S126 is set to be, for example, 5 seconds or more and 120 seconds or less.

When the execution number of the cycle is less than a target number (step S127, "NO"), an average film thicknesses of silicon nitride films does not reach a target value. Thus, the controller 100 performs the steps after step S121 again. When the execution number of the cycle is the target number (step S127, "YES"), the average film thicknesses of the silicon nitride films reaches the target value. Thus, the controller 100 terminates the present nitride film forming step.

Further, in the cycle of the present embodiment, the Si-containing layer modifying step (step S124) is carried out after the Si-containing layer forming step (step S122) and before the Si-containing layer nitriding step (step S126), but the technology of the present disclosure is not limited thereto. In the cycle, the modifying step (step S124) may be carried out after the Si-containing layer forming step (step S122) and after the Si-containing layer nitriding step (step S126). In this case, before the Si-containing layer forming step (step S122) in the (n+1)-th cycle, a portion that has not been nitrided through the Si-containing layer nitriding step (step S126) in the n-th cycle may be modified (where n is a natural number equal to or greater than one). The modified portion may be nitrided through the Si-containing layer nitriding step (step S126) in the (n+1)-th cycle.

Figure 7:
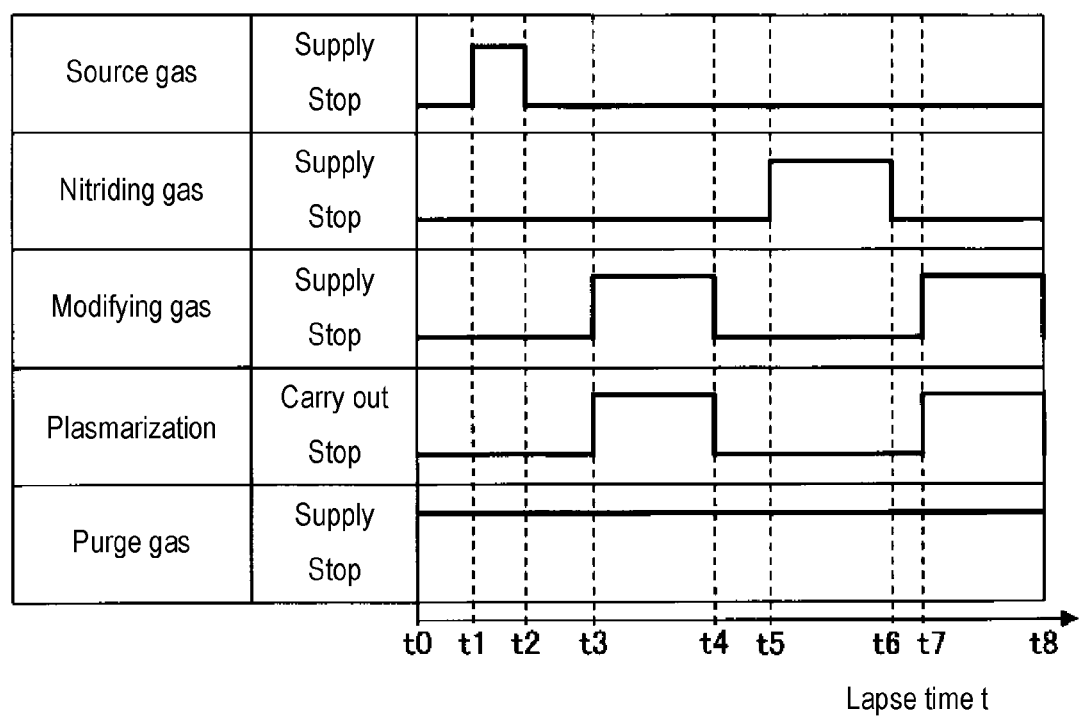
FIG. 7 is a view illustrating a modification of operation timings of one cycle.

FIG. 7 is a view illustrating a modification of operation timings of one cycle. In the cycle of the modification, the Si-containing layer modifying step (step S124) is carried out both after the Si-containing layer forming step (step S122) and before the Si-containing layer nitriding step (step S126), and after the Si-containing layer forming step (step S122) and after the Si-containing layer nitriding step (step S126). The operation timings of the one cycle illustrated in FIG. 7 are the same as those of the one cycle illustrated in FIG. 6 from time t0 to time t6. Hereinafter, differences between the operation timings of the one cycle illustrated in FIG. 7 and the operation timings of the one cycle illustrated in FIG. 6 will be described.

In the cycle of the modification, like from time t2 to time t3, the purge gas is supplied to the interior of the process vessel 11 by the purge gas supply mechanism 85 from time t6 to time t7, while the interior of the process vessel 11 is exhausted by the exhaust source 51. Accordingly, gases remaining in the interior of the process vessel 11 are replaced by the purge gas. As illustrated in FIG. 7, the purge gas is continuously supplied to the interior of the process vessel 11 from time t0 to time t8.

In the cycle of the modification, like from time t3 to time t4, the modifying gas is supplied to the interior of the process vessel 11 by the modifying gas supply mechanism 75 from time t7 to time t8, while the interior of the process vessel 11 is exhausted by the exhaust source 51. Further, from time t7 to time t8, the modifying gas is plasmarized by the plasma forming mechanism 90. The modifying gas is, for example, a mixture of a hydrogen gas and a nitrogen gas. The Si-containing layer is modified with the plasmarized modifying gas.

In the cycle of the modification, the Si-containing layer is modified again after the Si-containing layer nitriding step (step S126) is performed from time t5 to time t6. Before the Si-containing layer forming step (step S122) in the (n+1)-th cycle (where n is a natural number equal to or greater than one), a portion that has not been nitrided through the Si-containing layer nitriding step (step S126) in the n-th cycle may be modified. The modified portion may be nitrided through the Si-containing layer nitriding step (step S126) in the (n+1)-th cycle.

Examples and Comparative Examples

In Example 1, silicon nitride films were formed on silicon wafers by carrying out the cycle (steps S121 to S126) illustrated in FIG. 5 77 times with the operation timings illustrated in FIG. 6. The DCS gas was used as the source gas. A gas including a $H_2$ gas of 91 volume % and a $N_2$ gas of 9 volume % was used as the modifying gas. The modifying gas was plasmarized. A $NH_3$ gas was used as the nitriding gas. The nitriding gas was not plasmarized. A $N_2$ gas was used as the purge gas. While the cycle is repeated, a temperature of the silicon wafers was maintained at 550 degrees C.

In Comparative Example 1, silicon nitride films were formed as in Example 1 except that the Si-containing layer modifying step (step S124) and the purging step (step S123) just before the Si-containing layer modifying step (step S124) were not carried out and a temperature of the silicon wafers was maintained at 630 degrees C.

In Comparative Example 2, silicon nitride films were formed as in Example 1 except that the Si-containing layer modifying step (step S124) and the purging step (step S123) just before the Si-containing layer modifying step (step S124) were not carried out and the nitride gas was plasmarized in the Si-containing layer nitriding step (step S126). That is, the silicon nitride films were formed as in Comparative Example 1, except that the nitride gas was plasmarized in the Si-containing layer nitriding step (step S126) and the temperature of the silicon wafers was maintained at 550 degrees C.

Film forming conditions and evaluation results of the silicon nitride films in Example 1, Comparative Example 1, and Comparative Example 2 are shown in Table 1. Step coverages immediately after the film formation were good in all of Example 1, Comparative Example 1, and Comparative Example 2.

TABLE 1

| | | Example 1 | Comparative Example 1 | Comparative Example 2 |
|---|---|---|---|---|
| Film forming condition | Source gas | DCS | DCS | DCS |
| | Modifying gas ($H_2$:$N_2$) | 91:9 | — | — |
| | Plasmarization of modifying gas | Yes | — | — |
| | Nitriding gas | $NH_3$ | $NH_3$ | $NH_3$ |
| | Plasmarization of nitriding gas | No | No | Yes |
| | Wafer temperature (degrees C.) | 550 | 630 | 550 |
| Evaluation of films | Chlorine content (atoms/cc) | $5.7 \times 10^{19}$ | $1.7 \times 10^{20}$ | $1.3 \times 10^{20}$ |
| | Film density (g/cm$^3$) | 2.89 | 2.87 | 2.81 |
| | WER (angstrom/min) | 4.8 | 5.3 | 10.5 |
| | Jg@5 MV/cm (A/cm$^2$) | $1.6 \times 10^{-6}$ | $2.7 \times 10^{-4}$ | $4.2 \times 10^{-6}$ |

The "Chlorine content" is the number of chlorine elements in a unit volume of a silicon nitride film. The chlorine content was measured by a secondary ion mass spectrometry (SIMS). The film density was measured by an X-ray reflection rate (XRR) method. The "WER" is a wet etching rate. A dilute HF (DHF) having a fluoric acid of 0.5% was used as a wet etching liquid. The step coverages after the wet etching were good in all of Example 1, Comparative Example 1, and Comparative Example 2. The "Jg@5 MV/cm" denotes a leakage current per unit area.

As clearly shown in Table 1 through the comparison of Example 1 and Comparative Example 1, according to Example 1, since the Si-containing layer was modified, the Si-containing layer could be thermally nitrided at a low temperature (for example, equal to or less than 600 degrees C.) without plasmarizing the nitriding gas. Presence of modifying the Si-containing layer in Example 1 can be also confirmed by the low chlorine content. Further, according to Example 1, it can be confirmed that damage to the base was reduced by the thermal nitration at the low temperature, by the small leakage current even with the same level of quality (film density or WER). Damage to the base is a factor that influences the leakage current.

Further, as clearly shown in Table 1 through the comparison of Example 1 and Comparative Example 2, according to Example 1, since it is not necessary to plasmarize the nitriding gas in order to nitride the Si-containing layer at a low temperature, damage to the base could be reduced. Reduction in damage to the base implies that the leakage current is small.

Further, silicon nitride films having the same film density as that in Example 1 were obtained by forming the silicon nitride films under the same condition as that of Example 1, except that the temperature of the silicon wafers was maintained at 500 degrees C. The same film density implies that quality of the films are the same. From this result, it can be confirmed that, according to the technology of the present disclosure, the Si-containing layer can be nitrided without plasmarizing the nitride gas even when the temperature of the silicon wafer is lower than 550 degrees C. When the temperature of the silicon wafer is lower than 550 degrees C., thermal deterioration of an electric circuit and the like formed in the silicon wafer in advance can be further suppressed.

In Example 1, as described above, the silicon nitride films were formed on the silicon wafers by carrying out the cycle (steps S121 to S126) illustrated in FIG. 5 77 times with the operation timings illustrated in FIG. 6. The average film thicknesses of the silicon nitride films were 73.72 angstrom, and the film forming rate per one cycle was 0.96 angstrom.

In Comparative Example 3, the same processes as those in Example 1 were carried out, except that the Si-containing layer modifying step (step S124) and the purging step (step S123) just before the Si-containing layer modifying step (step S124) were not carried out. The average film thicknesses of the silicon nitride films were 13.97 angstrom, and the film forming rate per one cycle was 0.18 angstrom.

In Comparative Example 4, the same processes as those in Example 1 were carried, except that the Si-containing layer nitriding step (step S126) and the purging step (step S125) just before the Si-containing layer nitriding step (step S126) were not carried out. The average film thicknesses of the silicon nitride films were 17.97 angstrom, and the film forming rate per one cycle was 0.23 angstrom.

Film forming conditions and evaluation results of the silicon nitride films in Example 1, Comparative Example 3, and Comparative Example 4 are shown in Table 2. Further, average film thicknesses of silicon nitride films obtained in Example 1, Comparative Example 3, and Comparative Example 4 are shown in FIG. 8.

TABLE 2

| | | Example 1 | Comparative Example 3 | Comparative Example 4 |
|---|---|---|---|---|
| Film forming condition | Source gas | DCS | DCS | DCS |
| | Modifying gas ($H_2$:$N_2$) | 91:9 | — | 91:9 |
| | Plasmarization of modifying gas | Yes | — | Yes |
| | Nitriding gas | $NH_3$ | $NH_3$ | — |
| | Plasmarization of nitriding gas | No | No | — |
| | Wafer temperature (degrees C.) | 550 | 550 | 550 |
| | Execution number of cycle | 77 | 77 | 77 |
| Evaluation of films | Average film thickness (angstrom) | 73.72 | 13.97 | 17.97 |
| | Film forming rate (angstrom/cycle) | 0.96 | 0.18 | 0.23 |

Figure 8:
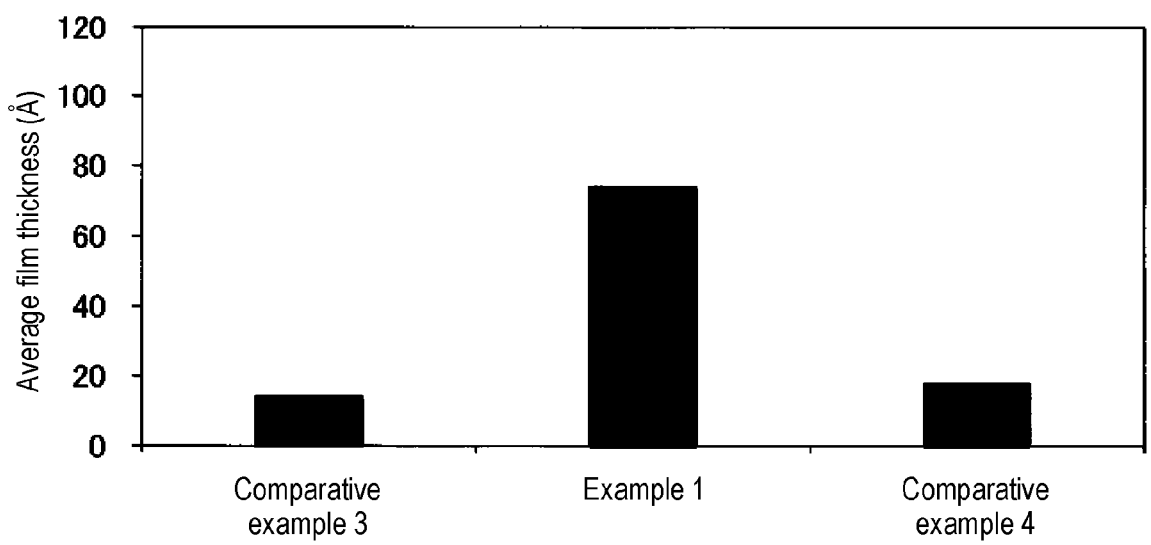
FIG. 8 is a view illustrating average film thicknesses of silicon nitride films obtained in Example 1, Comparative Example 3, and Comparative Example 4.

As clearly shown in Table 2 and FIG. 8 through the comparison of Example 1 and Comparative Example 3, according to Example 1, it can be confirmed that since the Si-containing layer was modified before the Si-containing layer was thermally nitrided, the thermal nitration of the Si-containing layer could be expedited and the film forming rate could be enhanced. In Comparative Example 3, since the Si-containing layer was not modified, the film forming rate was too low and thus it was difficult to obtain a film thickness of the target value.

Further, as clearly shown in Table 2 and FIG. 8 through the comparison of Example 1, Comparative Example 3, and Comparative Example 4, it can be confirmed that the Si-containing layer of Example 1 was modified under a condition that suppressed the Si-containing layer from being nitrided. This is because in Comparative Example 4, the film formation was performed only to the same degree as that in Comparative Example 3.

Next, a case in which a hydrogen content in a modifying gas was changed will be described. In Example 1, as described above, the gas including a $H_2$ gas of 91 volume % and a $N_2$ gas of 9 volume % was used as the modifying gas.

In Example 2, silicon nitride films were formed under the same condition as that of Example 1, except that a gas including an $H_2$ gas of 100 volume % was used as the modifying gas.

In Example 3, silicon nitride films were formed under the same condition as that of Example 1, except that a gas including an $N_2$ gas of 100 volume % was used as the modifying gas.

The film forming conditions and evaluation results of the silicon nitride films in Example 1, Example 2, and Example 3 are shown in Table 3.

TABLE 3

| | | Example 1 | Example 2 | Example 3 |
|---|---|---|---|---|
| Film forming condition | Source gas | DCS | DCS | DCS |
| | Modifying gas ($H_2:N_2$) | 91:9 | 100:0 | 0:100 |
| | Plasmarization of modifying gas | Yes | Yes | Yes |
| | Nitriding gas | $NH_3$ | $NH_3$ | $NH_3$ |
| | Plasmarization of nitriding gas | No | No | No |
| | Wafer temperature (degrees C.) | 550 | 550 | 550 |
| Evaluation of films | WER (angstrom/min) | 4.8 | 3.0 | 3.9 |

As clearly shown in Table 3, the "WER" of Example 2 was the smallest, the "WER" of Example 3 was the second smallest, and the "WER" of Example 1 was the largest. From this results, it can be confirmed that the highest modification effect can be obtained by using the $H_2$ gas alone as the modifying gas.

Next, a case in which a gas other than the DCS gas was used as the source gas will be described. In Example 1, as described above, the DCS gas was used as the source gas.

In Example 4, silicon nitride films were formed under the same condition as that in Example 1, except that a HCDS gas was used as the source gas, the temperature of the silicon wafers was maintained at 400 degrees C., and the number of the cycles was set to 150.

In Comparative Example 5, silicon nitride films were formed under the same condition as that in Example 4, except that the Si-containing layer modifying step (step S124) and the purging step (step S123) just before the Si-containing layer modifying step (step S124) were not carried out.

Figure 9:
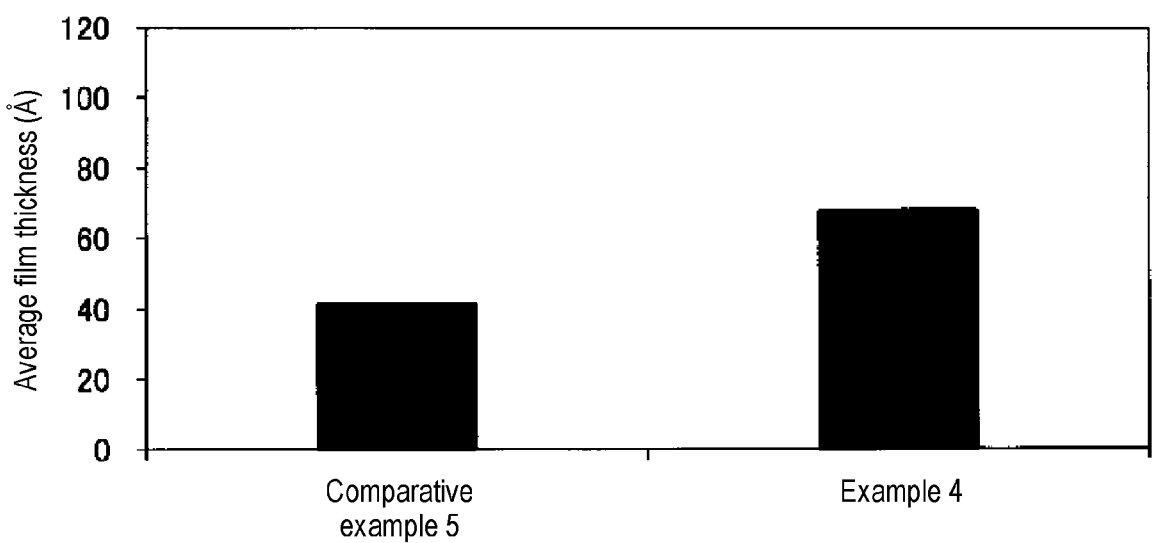
FIG. 9 is a view illustrating average film thicknesses of silicon nitride films obtained in Example 4 and Comparative Example 5.

The film forming conditions and evaluation results of the silicon nitride films in Example 4 and Comparative Example 5 are shown in Table 4. Further, average film thicknesses of the silicon nitride films obtained in Example 4 and Comparative Example 5 are illustrated in FIG. 9.

TABLE 4

| | | Example 4 | Comparative Example 5 |
|---|---|---|---|
| Film forming condition | Source gas | HCDS | HCDS |
| | Modifying gas ($H_2:N_2$) | 91:9 | — |
| | Plasmarization of modifying gas | Yes | — |
| | Nitriding gas | $NH_3$ | $NH_3$ |
| | Plasmarization of nitriding gas | No | No |
| | Wafer temperature (degrees C.) | 400 | 400 |
| | Execution number of cycle | 150 | 150 |
| Evaluation of films | Average film thickness (angstrom) | 67.80 | 41.36 |
| | Film forming rate (angstrom/cycle) | 0.45 | 0.28 |

According to Comparative Example 5, when the HCDS gas was used as the source gas, the Si-containing layer could be thermally nitrided at 400 degrees C. without plasmarizing the nitriding gas even when the Si-containing layer modifying step (step S124) was not carried out. According to Example 4, when the HCDS gas was used as the source gas, the thermal nitration of the Si-containing layer could be expedited and the film forming rate could be enhanced by carrying out the Si-containing layer modifying step (step S124).

Next, a case in which a nitride film including at least one impurity selected from carbon, oxygen, boron, and fluorine in addition to nitrogen is formed will be described with reference to FIGS. 10, 11, and 12. Hereinafter, differences with respect to the case in which a nitride film without including impurities is formed will be mainly described.

Figure 10:
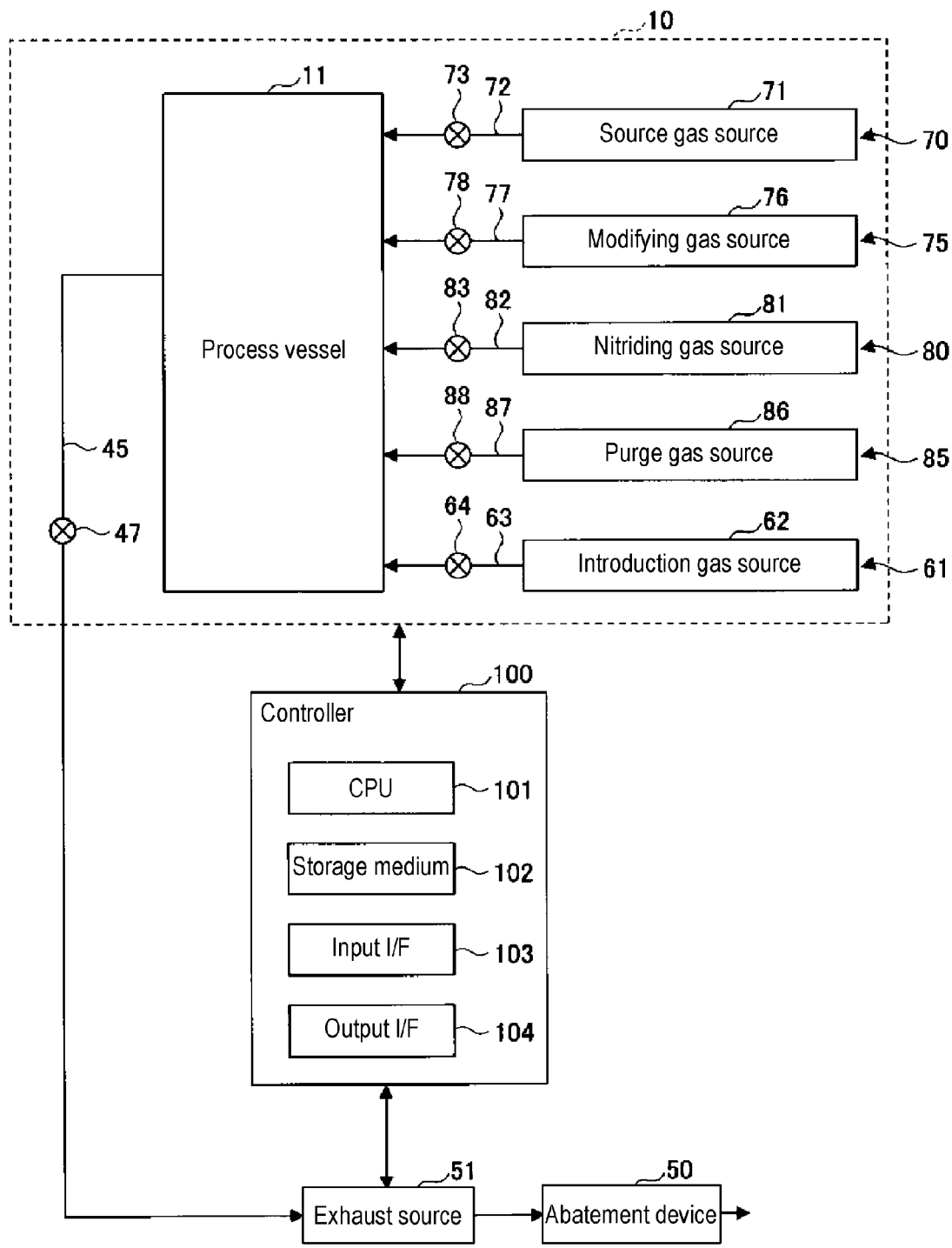
FIG. 10 is a view illustrating a modification of a film forming apparatus.

As illustrated in FIG. 10, the process unit 10 includes an introduction gas supply mechanism 61, in addition to the source gas supply mechanism 70, the modifying gas supply mechanism 75, the nitriding gas supply mechanism 80, and the purge gas supply mechanism 85. The introduction gas supply mechanism 61 supplies an introduction gas to the interior of the process vessel 11. The introduction gas includes at least one impurity selected from carbon, oxygen, boron, and fluorine, and the impurity is introduced into a nitride film such as a silicon nitride film. Although not illustrated, a gas supply pipe for the introduction gas has a vertical pipe vertically disposed in the interior of the process vessel 11, like the gas supply pipe 40A for the source gas illustrated in FIG. 2.

The introduction gas supply mechanism 61 has an introduction gas source 62, an introduction gas pipe 63, and an introduction gas flow rate control valve 64. The introduction gas pipe 63 connects the introduction gas source 62 and the vertical pipe of the gas supply pipe for the introduction gas and delivers the introduction gas from the introduction gas source 62 to the vertical pipe of the gas supply pipe for the introduction gas. The introduction gas flow rate control valve 64 is provided in the introduction gas pipe 63, and controls a flow rate of the introduction gas.

When carbon is introduced as the impurity, a hydrocarbon gas or the like may be used as the introduction gas. A specific example of the hydrocarbon gas may include a $C_4H_6$ gas. When oxygen is introduced as the impurity, $O_2$, $O_3$, $N_2O$, NO, CO, $CO_2$, or the like may be used as the introduction gas. When boron is introduced as the impurity, $BCl_3$, $B_2H_6$, tridimethylaminoboron (TDMAB), or the like may be used as the introduction gas. When fluorine is introduced as the impurity, $F_2$, HF, $SiF_4$, or the like may be used as the introduction gas.

Figure 11:
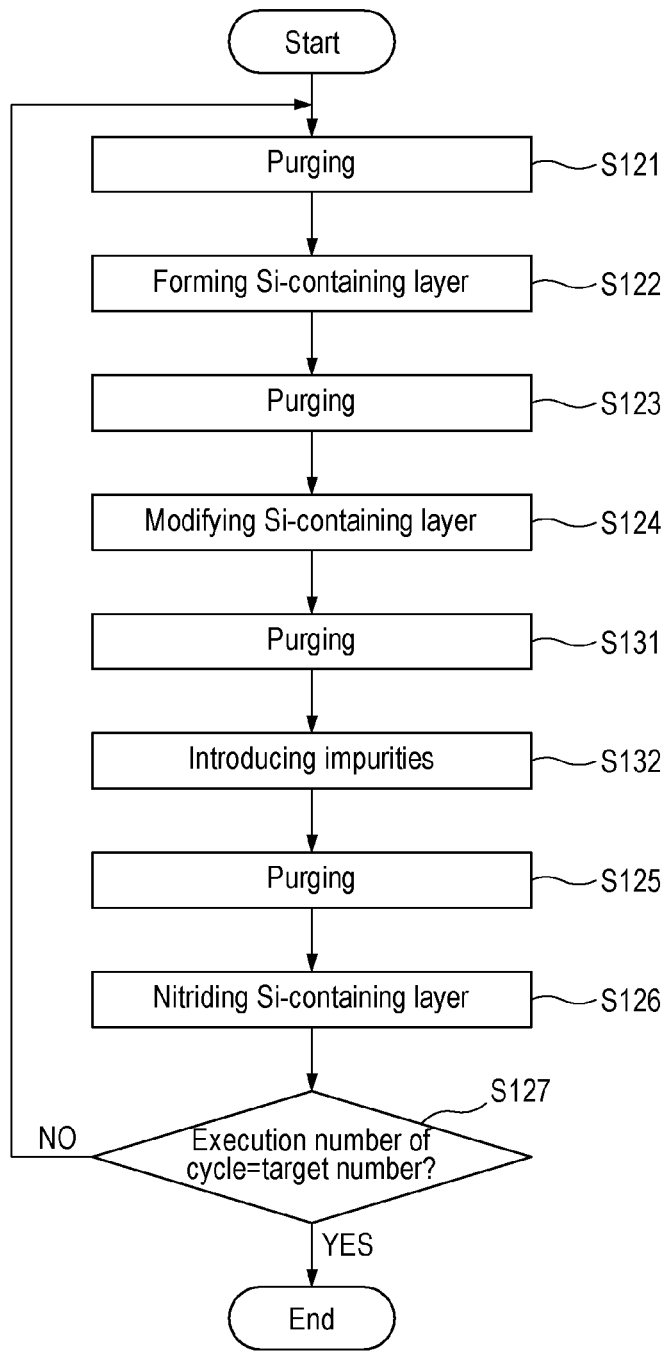
FIG. 11 is a flowchart illustrating an example of a film forming method using the film forming apparatus illustrated in FIG. 10.

As illustrated in FIG. 11, in the film forming step S12, a cycle described below is repeated, for example, until an execution number of the cycle reaches a target number. The cycle includes, for example, a purging step (step S131) and an impurity introduction step (step S132), in addition to the purging step (step S121), the Si-containing layer forming step (step S122), the purging step (step S123), the Si-containing layer modifying step (step 124), purging (step S125), and the Si-containing layer nitriding step (step S126). While the cycle is repeated, the temperature of the substrates 2 is set to be, for example, 400 degrees C. or more and 600 degrees C. or less, and the pressure of the interior of the process vessel 11 is set to be, for example, 13 Pa or more and 2,000 Pa or less.

Figure 12:
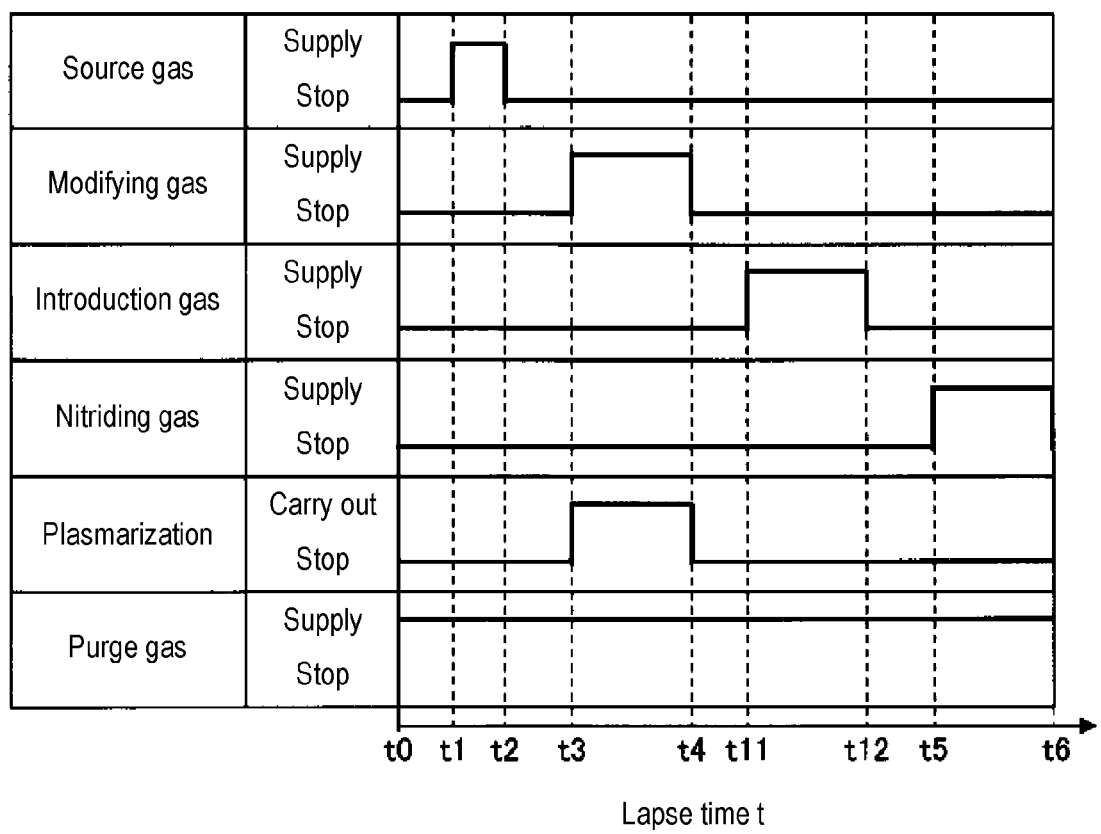
FIG. 12 is a view illustrating an example of operation timings of one cycle illustrated in FIG. 11.

The purging step (step S131) is performed from time t4 to time t11 illustrated in FIG. 12. In step S131, a purge gas is supplied to the interior of the process vessel 11 by the purge gas supply mechanism 85 while the interior of the process vessel 11 is exhausted by the exhaust source 51. Accordingly, gases remaining in the interior of the process vessel 11 are replaced by the purge gas. A flow rate of the purge gas is set to be, for example, 10 sccm or more and 5,000 sccm or less. A time period of step S131 is set to be, for example, 3 seconds or more and 10 seconds or less. The purge gas may be supplied from a gas supply mechanism other than the purge gas supply mechanism 85. Further, as illustrated in FIG. 12, the purge gas is continuously supplied to the interior of the process vessel 11 from time t0 to time t6. The flow rate of the purge gas may be appropriately set for the purging step.

The impurity introduction (step S132) is carried out from time t11 to time t12 illustrated in FIG. 12. In step S132, the introduction gas is supplied to the interior of the process vessel 11 by the introduction gas supply mechanism 61 while the interior of the process vessel 11 is exhausted by the exhaust source 51. The introduction gas is, for example, a $C_4H_6$ gas. Accordingly, C may be introduced into the Si-containing layer as the impurities. A flow rate of the introduction gas is set to be, for example, 10 sccm or more and 3,000 sccm or less. A time period of step S132 is set to be, for example, 1 seconds or more and 60 seconds or less. The introduction gas is not plasmarized by the plasma forming mechanism 90.

As in the cycle illustrated in FIG. 5, the cycle of the present modification includes the Si-containing layer modifying step (step S124). Accordingly, as described above, the Si-containing layer can be thermally modified at a low temperature (for example, 600 degrees C. or less, specifically, 550 degrees C. or less). Since it is not necessary to plasmarize the nitriding gas, damage to the base can be reduced. Further, since it is not necessary to plasmarize the nitriding gas, it is possible to suppress deposits from being detached from the process vessel 11, and to reduce a frequency of cleanings the process vessel 11.

Further, as in the cycle illustrated in FIG. 5, in the cycle of the present modification, the Si-containing layer modifying step (step S124) is carried out after the Si-containing layer forming step (step S122) and before the Si-containing layer nitriding step (step S126). Thus, the Si-containing layer formed in the n-th cycle can be modified and nitrided before a new Si-containing layer is formed thereon. Accordingly, the modification and the nitration efficiency is good.

Further, as described above, in the cycle, the Si-containing layer modifying step (step S124) may be carried out after the Si-containing layer forming step (step S122) and after the Si-containing layer nitriding step (step S126). In this case, a portion of the Si-containing layer, which has been formed in the n-th cycle but has not been nitrided in the n-th cycle, may be modified before a new Si-containing layer is formed thereon. The portion modified as described above and the Si-containing layer formed in the (n+1)-th cycle can be nitrided in the (n+1)-th cycle. Further, in the cycle, the Si-containing modifying step (step S124) may be carried out before and after the Si-containing layer nitriding step (step S126).

Unlike the cycle illustrated in FIG. 5, the cycle of the present modification further includes the impurity introduction step (step S132). According to the present modification, as described above, since the nitriding gas is not plasmarized, the impurities (for example, C) can be suppressed from coming out from the Si-containing layer. If the nitriding gas is plasmarized, impurities introduced into the Si-containing layer before nitriding step come out from the Si-containing layer during the nitriding step, and thus the impurity content is reduced.

Further, in the cycle of the present modification, the impurity introduction step (step S132) is carried out after the Si-containing layer modifying step (step S124) and before the Si-containing layer nitriding step (step S126). Thus, the Si-containing layer formed in the n-th cycle (where n is a natural number greater than one) can be modified, carbonized, and nitrided before a new Si-containing layer is formed thereon.

Further, in the cycle of the present modification, the impurity introduction step (step S132) may be carried out after the Si-containing layer modifying step (step S124) and after the Si-containing layer nitriding step (step S126). The impurities introduced in the n-th cycle can be suppressed from coming out from the Si-containing layer during the nitriding step of the (n+1)-th cycle. Further, in the cycle, in order to increase an introduction amount of the impurities, the impurity introduction step (step S132) may be carried out before and after the Si-containing layer nitriding step (step S126).

Examples and Comparative Examples

In Example 5, silicon carbon nitride films were formed on silicon wafers by carrying out the cycle (steps S121 to S126 and steps S131 to S132) illustrated in FIG. 11 99 times with the operation timings illustrated in FIG. 12. A DCS gas was used as the source gas. A gas including a $H_2$ gas of 91 volume % and a $N_2$ gas of 9 volume % was used as the modifying gas. The modifying gas was plasmarized. A $C_4H_6$ gas was used as the introduction gas. The introduction gas was not plasmarized. A pressure in the interior of the process vessel 11 in the impurity introduction step (step S132) was set to be 1,200 Pa (9 Torr). The $NH_3$ gas was used as the nitriding gas. The nitriding gas was not plasmarized. A $N_2$ gas was used as the purge gas. While the cycle is repeated, a temperature of the silicon wafers was maintained at 550 degrees C.

In Example 6, silicon carbon nitride films were formed under the same condition as that in Example 5, except that the pressure in the interior of the process vessel 11 during the impurity introduction step (step S132) was changed from 1,200 Pa (9 Torr) to 1,733 Pa (13 Torr).

In Comparative Example 6, silicon carbon nitride films were formed under the same condition as that in Example 5, except that the Si-containing layer modifying step (step S124) and the purging step (step S123) just before the Si-containing layer modifying step (step S124) were not carried out and the nitriding gas was plasmarized in the Si-containing layer nitriding step (step S126).

In Comparative Example 7, silicon carbon nitride films were formed under the same condition as that in Example 5, except that the nitriding gas was plasmarized in the Si-containing layer nitriding step (step S126).

Film forming conditions and measurement results of chemical compositions of the silicon carbon nitride films in Example 5, Example 6, Comparative Example 6, and Comparative Example 7 are shown in Table 5. Step coverages immediately after the film formation were good in all of Example 5, Example 6, Comparative Example 6, and Comparative Example 7.

TABLE 5

|  |  | Example 5 | Example 6 | Comparative Example 6 | Comparative Example 7 |
|---|---|---|---|---|---|
| Film forming condition | Source gas | DCS | DCS | DCS | DCS |
|  | Modifying gas ($H_2:N_2$) | 91:9 | 91:9 | — | 91:9 |
|  | Plasmarization of modifying gas | Yes | Yes | — | Yes |
|  | Introduction gas | $C_4H_6$ | $C_4H_6$ | $C_4H_6$ | $C_4H_6$ |
|  | Plasmarization of introduction gas | No | No | No | No |
|  | Pressure during supply of introduction gas (Pa) | 1,200 | 1,733 | 1,200 | 1,200 |
|  | Nitriding gas | $NH_3$ | $NH_3$ | $NH_3$ | $NH_3$ |
|  | Plasmarization of nitriding gas | No | No | Yes | Yes |
|  | Wafer temperature (degrees C.) | 550 | 550 | 550 | 550 |
| Film composition | Si content (mol %) | 38.5 | 38.5 | 38.1 | 38.6 |
|  | C content (mol %) | 2.1 | 4.9 | 0.7 | 0.9 |
|  | N content (mol %) | 47.9 | 46.9 | 49.4 | 50.5 |
|  | O content (mol %) | 11.5 | 9.7 | 11.8 | 10.0 |

The chemical compositions of the silicon carbon nitride films were measured by an X-ray photoelectron spectrography (XPS).

As clearly shown from Table 5, according to Examples 5 and 6, since the Si-containing layer was modified, the Si-containing layer could be thermally nitrided at a relatively low temperature of 550 degrees C. without plasmarizing the nitriding gas. The N content clearly shows that the thermal nitration was carried out.

Further, as clearly shown in Table 5 through the comparison of Example 5, Comparative Example 6, and Comparative Example 7, according to Example 5, since it was not necessary to plasmarize the nitriding gas, C introduced into the Si-containing layer in advance could be suppressed from coming out from the Si-containing layer.

Further, silicon carbon nitride films having the same film density as that in Example 5 were obtained by forming the silicon carbon nitride films under the same condition as that of Example 5, except that the temperature of the silicon wafers was maintained at 500 degrees C. The same film density implies that quality of the films are the same. From this result, it can be confirmed that, according to the technology of the present disclosure, the Si-containing layer can be nitrided without plasmarizing the nitriding gas even when the temperature of the silicon wafer is lower than 550 degrees C. When the temperature of the silicon wafer is lower than 550 degrees C., thermal deterioration of an electric circuit and the like formed in the silicon wafer in advance can be further suppressed.

As described above, a film to be formed may be a nitride film, and may be also a nitride film including one or more of oxygen, carbon, boron, and fluorine, in addition to nitrogen. For example, a silicon nitride film may be SiON, SiCN, SiOCN, SiBN, SiBCN, SiBOCN, SiFN, or SiCFN, in addition to SiN. One or more elements selected from oxygen, carbon, boron, and fluorine are introduced into the Si-containing layer in the Si-containing layer modifying step (step S124), the Si-containing layer nitriding step (step S126), or an additionally provided step. The introduction step may be carried out during the cycle of forming the nitride film.

Further, in the specification, a silicon nitride is denoted by SiN, regardless of a ratio of silicon (Si) and nitrogen (N). For example, "SiN" includes a silicon nitride including silicon and nitrogen at a ratio of 3:4, that is, $Si_3N_4$. Similar notation may be applied to "SiON", "SiCN" "SiOCN" "SiBN", "SiBCN", "SiBOCN", "SiFN", and "SiCFN".

Although embodiments of the film forming method and the film forming apparatus of the present disclosure have been described, the present disclosure is not limited to the embodiments described above. Various changes, modifications, substitutions, additions, deletions, and combinations can be made within the categories described in claims. Such variations also fall within a technical scope of the present disclosure.

For example, a film to be formed may be a nitride film, and is not limited to a silicon nitride film. For example, the technology of the present disclosure may be also applied to a titanium nitride film, a boron nitride film, a tungsten nitride film, and an aluminum nitride film. When the titanium nitride film is formed, a $TiCl_4$ gas, for example, is used as the source gas. When the boron nitride film is formed, a $BCl_3$ gas, for example, is used as the source gas. When the tungsten nitride film is formed, a $WCl_6$ gas, for example, is used as the source gas. When the aluminum nitride film is formed, an $AlCl_3$ gas, for example, is used as the source gas.

Further, the method of plasmarizing the modifying gas is not limited to the method of applying a high-frequency electric field to the inner space of the accommodation part 19. Other inductively coupled plasma, microwave plasma, and the like may be used.

The substrate 2 is not limited to a semiconductor substrate such as a silicon wafer, and may be a glass substrate.

According to the embodiments of the present disclosure, a nitride film may be formed at a low temperature, and damage to a base on which the nitride film is to be formed can be reduced.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride film forming method comprising repeating a cycle a plurality of times, the cycle comprising:
   forming a layer containing an element to be nitrided on a substrate by supplying a source gas including the element to the substrate;
   plasmarizing a modifying gas including a hydrogen gas, and modifying the layer containing the element with the plasmarized modifying gas; and
   activating a nitriding gas including nitrogen by heat, and thermally nitriding the layer containing the element with the nitriding gas activated by heat without plasmarizing the nitriding gas,
   wherein the layer containing the element includes a halogen element,
   wherein the modifying the layer containing the element includes removing the halogen element included in the layer containing the element, and
   wherein the plasmarizing the modifying gas includes supplying the modifying gas,
   wherein the activating the nitriding gas includes supplying the nitriding gas,
   wherein, in the supplying the source gas, the supplying the modifying gas and the supplying the nitriding gas are not performed,
   wherein, in the supplying the modifying gas, the supplying the source gas and the supplying the nitriding gas are not performed, and
   wherein, in the supplying the nitriding gas, the supplying the source gas and the supplying the modifying gas are not performed.

2. The method of claim 1, wherein the modifying gas includes an inert gas in addition to the hydrogen gas.

3. The method of claim 1, wherein the modifying the layer containing the element is carried out after the forming the layer containing the element on the substrate and before the thermally nitriding the layer containing the element.

4. The method of claim 1, wherein the modifying the layer containing the element is carried out after the forming the layer containing the element on the substrate and after the thermally nitriding the layer containing the element.

5. The method of claim 1, wherein the modifying the layer containing the element is carried out after the forming the layer containing the element on the substrate and before the thermally nitriding the layer containing the element, and is further carried out after the forming the layer containing the element on the substrate and after the thermally nitriding the layer containing the element.

6. The method of claim 1, wherein the cycle further comprises introducing at least one impurity selected from carbon, oxygen, boron, and fluorine to the layer containing the element by supplying an introduction gas including the at least one impurity to the substrate.

7. The method of claim 6, wherein the introducing the at least one impurity to the layer containing the element is carried out after the modifying the layer containing the element and before the thermally nitriding the layer containing the element.

8. The method of claim 1, wherein while the cycle is repeated the plurality of times, a temperature of the substrate is kept to be lower than 550 degrees C.

9. A nitride film forming method comprising repeating a cycle a plurality of times, the cycle comprising:
   forming a layer containing an element to be nitrided on a substrate by supplying a source gas including the element to the substrate;
   plasmarizing a modifying gas including an inert gas, and modifying the layer containing the element with the plasmarized modifying gas; and
   activating a nitriding gas including nitrogen by heat, and thermally nitriding the layer containing the element with the nitriding gas activated by heat without plasmarizing the nitriding gas,
   wherein the layer containing the element includes a halogen element,
   wherein the modifying the layer containing the element includes removing the halogen element included in the layer containing the element, and
   wherein the plasmarizing the modifying gas includes supplying the modifying gas,
   wherein the activating the nitriding gas includes supplying the nitriding gas,
   wherein, in the supplying the source gas, the supplying the modifying gas and the supplying the nitriding gas are not performed,
   wherein, in the supplying the modifying gas, the supplying the source gas and the supplying the nitriding gas are not performed, and
   wherein, in the supplying the nitriding gas, the supplying the source gas and the supplying the modifying gas are not performed.

10. The method of claim 9, wherein the modifying the layer containing the element is carried out after the forming the layer containing the element on the substrate and before the thermally nitriding the layer containing the element.

11. The method of claim 9, wherein the modifying the layer containing the element is carried out after the forming the layer containing the element on the substrate and after the thermally nitriding the layer containing the element.

12. The method of claim 9, wherein the modifying the layer containing the element is carried out after the forming the layer containing the element on the substrate and before the thermally nitriding the layer containing the element, and is further carried out after the forming the layer containing the element on the substrate and after the thermally nitriding the layer containing the element.

13. The method of claim 9, wherein the cycle further comprises introducing at least one impurity selected from carbon, oxygen, boron, and fluorine to the layer containing the element by supplying an introduction gas including the at least one impurity to the substrate.

14. The method of claim 9, wherein while the cycle is repeated the plurality of times, a temperature of the substrate is kept to be lower than 550 degrees C.

* * * * *